US012587758B2

(12) United States Patent
Takaiwa et al.

(10) Patent No.: US 12,587,758 B2
(45) Date of Patent: Mar. 24, 2026

(54) IMAGING DEVICE, IMAGING METHOD, AND STORAGE MEDIUM

(71) Applicant: CANON KABUSHIKI KAISHA, Tokyo (JP)

(72) Inventors: Kan Takaiwa, Tokyo (JP); Aihiko Numata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 98 days.

(21) Appl. No.: 18/437,342

(22) Filed: Feb. 9, 2024

(65) Prior Publication Data

US 2024/0292124 A1 Aug. 29, 2024

(30) Foreign Application Priority Data

Feb. 24, 2023 (JP) ................................. 2023-027211

(51) Int. Cl.
| | |
|---|---|
| *H04N 25/62* | (2023.01) |
| *H04N 25/13* | (2023.01) |
| *H04N 25/79* | (2023.01) |
| *H10F 39/18* | (2025.01) |

(52) U.S. Cl.
CPC ........... *H04N 25/62* (2023.01); *H04N 25/134* (2023.01); *H04N 25/79* (2023.01); *H10F 39/182* (2025.01)

(58) Field of Classification Search
CPC ...... H04N 25/62; H04N 25/134; H04N 25/79; H04N 23/81; H04N 25/60; H10F 39/182; G01J 1/44; G01J 2001/442; G01J 2001/444; G01J 2001/4466; G01J 1/0488; G01J 1/4228
USPC ....................................................... 348/241
See application file for complete search history.

(56) References Cited

U.S. PATENT DOCUMENTS

| | | | |
|---|---|---|---|
| 9,307,170 B2 | 4/2016 | Numata | |
| 9,319,607 B2 | 4/2016 | Numata | |
| 9,402,041 B2 | 7/2016 | Numata | |
| 10,165,215 B2 | 12/2018 | Numata | |
| 2007/0194249 A1* | 8/2007 | Gavrilov | ............ G01N 21/6452 |
| | | | 250/459.1 |
| 2018/0211990 A1 | 7/2018 | Yorikado | |
| 2018/0253404 A1* | 9/2018 | Moore | .................. G01S 7/4876 |

(Continued)

FOREIGN PATENT DOCUMENTS

WO 2020/201849 A1 10/2020

OTHER PUBLICATIONS

I. Rech et al., "Optical crosstalk in single photon avalanche diode arrays: a new complete model", OpEx 16 (12), 2008.

(Continued)

*Primary Examiner* — Lin Ye
*Assistant Examiner* — Chan T Nguyen
(74) *Attorney, Agent, or Firm* — Venable LLP

(57) ABSTRACT

An imaging device includes: a photoelectric conversion element including an avalanche photodiode; a generation unit configured to generate an image based on a signal acquired by the photoelectric conversion element; a first correction unit configured to correct the image based on first characteristic information on crosstalk between pixels of the photoelectric conversion element; and a second correction unit configured to perform pixel interpolation of the image based on second characteristic information for determining a crosstalk region to neighboring pixels of a specific pixel and the image.

10 Claims, 21 Drawing Sheets

(56) References Cited

U.S. PATENT DOCUMENTS

| | | | |
|---|---|---|---|
| 2021/0266503 A1* | 8/2021 | Choi | H04N 25/611 |
| 2022/0187431 A1* | 6/2022 | Mcleod | G01S 7/497 |
| 2024/0107192 A1 | 3/2024 | Numata | |
| 2024/0107199 A1 | 3/2024 | Numata | |
| 2024/0163576 A1* | 5/2024 | Yi | H04N 25/617 |
| 2025/0168522 A1* | 5/2025 | El-Yamany | H04N 25/134 |

OTHER PUBLICATIONS

Baptiste Courme et al., "Manipulation and certification of high-dimensional entanglement through a scattering medium", Jan. 11, 2023.

V. Tabacchini et al., "Probabilities of triggering and validation in a digital silicon photomultiplier", Jun. 18, 2014.

Search Report dated Jul. 8, 2024, in European Patent Application No. 24157243.7.

U.S. Appl. No. 18/418,763, filed Jan. 22, 2024 (First Named Inventor: Aihiko Numata).

U.S. Appl. No. 18/437,332, filed Feb. 9, 2024 (First Named Inventor: Suguru Hosono).

U.S. Appl. No. 18/443,556, filed Feb. 16, 2024 (First Named Inventor: Ryota Sando).

* cited by examiner

| | | | | |
|---|---|---|---|---|
| 0% | 0% | 1% | 0% | 0% |
| 0% | 0.5% | 2% | 0.5% | 0% |
| 1% | 2% | 100% | 2% | 1% |
| 0% | 0.5% | 2% | 0.5% | 0% |
| 0% | 0% | 1% | 0% | 0% |

FIG. 8

| N/A | N/A | 10000 | N/A | N/A |
|---|---|---|---|---|
| N/A | 5000 | 1000 | 5000 | N/A |
| 10000 | 1000 | 20 | 1000 | 10000 |
| N/A | 5000 | 1000 | 5000 | N/A |
| N/A | N/A | 10000 | N/A | N/A |

FIG. 12

| | | | | |
|---|---|---|---|---|
| (−2,−2) | (−1,−2) | (0,−2) | (1,−2) | (2,−2) |
| (−2,−1) | (−1,−1) | (0,−1) | (1,−1) | (2,−1) |
| (−2,0) | (−1,0) | (0,0) | (1,0) | (2,0) |
| (−2,1) | (−1,1) | (0,1) | (1,1) | (2,1) |
| (−2,2) | (−1,2) | (0,2) | (1,2) | (2,2) |

FIG. 13

| Defect level determination threshold value | Defect level |
|---|---|
| 1024 or greater | 1 |
| 2048 or greater | 2 |
| 4096 or greater | 3 |
| 8192 or greater | 4 |
| 16384 or greater | 5 |
| 32768 or greater | 6 |
| 65536 or greater | 7 |
| 131072 or greater | 8 |

FIG. 14

| R | G | R | G | R | G |
|---|---|---|---|---|---|
| G | B | G | B | G | B |
| R | G | R | G | R | G |
| G | B | G | B | G | B |
| R | G | R | G | R | G |
| G | B | G | B | G | B |

FIG. 17C

| 4000 | 4000 | 4000 | 4000 | 4000 |

FIG. 17B

| 4000 | 4000 | 4000 | 4000 | 4000 |
| 4000 | 4000 | 4000 | 4000 | 4000 |
| 4000 | 4000 | 4000 | 4000 | 4000 |

FIG. 17A

| 4000 | 4000 | 4000 | 4000 | 4000 |
| 4000 | 4000 | 4000 | 4000 | 4000 |

FIG. 19A

| 0 | 0 | 40 | 0 | 0 |
|---|---|---|---|---|
| 0 | 20 | 80 | 20 | 0 |
| 40 | 80 | 4000 | 80 | 40 |
| 0 | 20 | 80 | 20 | 0 |
| 0 | 0 | 40 | 0 | 0 |

FIG. 19B

| 0 | 0 | 0 | 0 | 0 |
|---|---|---|---|---|
| 0 | 0 | 0 | 0 | 0 |
| 0 | 0 | 4000 | 0 | 0 |
| 0 | 0 | 0 | 0 | 0 |
| 0 | 0 | 0 | 0 | 0 |

FIG. 21

| Defect level | Defect level determination threshold value | | | | | |
|---|---|---|---|---|---|---|
| | One times | Two times | Four times | Eight times | Sixteen times | Thrity two times |
| 1 | 1024 | 512 | 256 | 128 | 64 | 32 |
| 2 | 2048 | 1024 | 512 | 256 | 128 | 64 |
| 3 | 4096 | 2048 | 1024 | 512 | 256 | 128 |
| 4 | 8192 | 4096 | 2048 | 1024 | 512 | 256 |
| 5 | 16384 | 8192 | 4096 | 2048 | 1024 | 512 |
| 6 | 32768 | 16384 | 8192 | 4096 | 2048 | 1024 |
| 7 | 65536 | 32768 | 16384 | 8192 | 4096 | 2048 |
| 8 | 131072 | 65536 | 32768 | 16384 | 8192 | 4096 |

IMAGING DEVICE, IMAGING METHOD, AND STORAGE MEDIUM

BACKGROUND OF THE INVENTION

Field of the Invention

The present invention relates to an imaging device including an avalanche photodiode, an imaging method, and a storage medium.

Description of the Related Art

For example, as described in Document 1 (I. Rech et al., "Optical crosstalk in single photon avalanche diode arrays: a new complete model," OpEx 16(12), 2008), an imaging device that digitally counts the number of photons arriving at an avalanche photodiode (APD) and outputs the counted value as a photoelectrically converted digital signal from pixels has been proposed.

However, in the imaging device including an APD described in Document 1, it is known that a phenomenon of avalanche luminescence occurs. When avalanche luminescence occurs, generated secondary electrons are input to neighboring pixels, a count value of neighboring pixel values increases, and thus there is a problem that erroneous counting is caused.

Therefore, an objective of the present invention is to provide an imaging device that includes an avalanche photodiode and can curb deterioration in image quality.

SUMMARY OF THE INVENTION

An imaging device according to one aspect of the present invention is an imaging device including a photoelectric conversion element including an avalanche photodiode, at least one processor, and a memory coupled to the at least one processor, the memory storing instructions that, when executed by the at least one processor, cause the at least one processor to: generate an image by a generation unit based on a signal acquired by the photoelectric conversion element; correct the image by a first correction unit based on first characteristic information on crosstalk between pixels of the photoelectric conversion element; and perform pixel interpolation of the image by a second correction unit based on second characteristic information for determining a crosstalk region to neighboring pixels of a specific pixel and the image.

Further features of the present invention will become apparent from the following description of embodiments with reference to the attached drawings.

BRIEF DESCRIPTION OF THE DRAWINGS

FIG. 6 is a functional block diagram illustrating an example of a configuration of an imaging device according to the first embodiment.

FIG. 7 is a diagram illustrating an example of a probability distribution in which erroneous counting will occur between neighboring pixels of the photoelectric conversion element 100 as first array data.

FIG. 8 is a diagram illustrating an example of second array data in which threshold values for determining whether a defect correcting process is necessary for neighboring pixels according to a state of a pixel of interest are stored.

FIG. 12 is a diagram illustrating relative coordinates of pixels in the imaging device.

FIG. 13 is a diagram illustrating an example of defect level determination threshold values.

FIG. 14 is a diagram illustrating an example of a Bayer array of color filters in the imaging device.

FIGS. 17A to 17C are diagrams illustrating an example in which an error of a specific pixel is detected.

FIG. 19A is a diagram illustrating an example of a pixel value distribution when an interest pixel value is 4000 and a defect occurs in a pixel part and FIG. 19B is a diagram illustrating an example of a pixel value distribution when a defect occurs in a part other than the pixel part.

FIG. 21 is a diagram illustrating an example of threshold values when a threshold value differs for each gain scale factor according to a sixth embodiment.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

Figure 1:
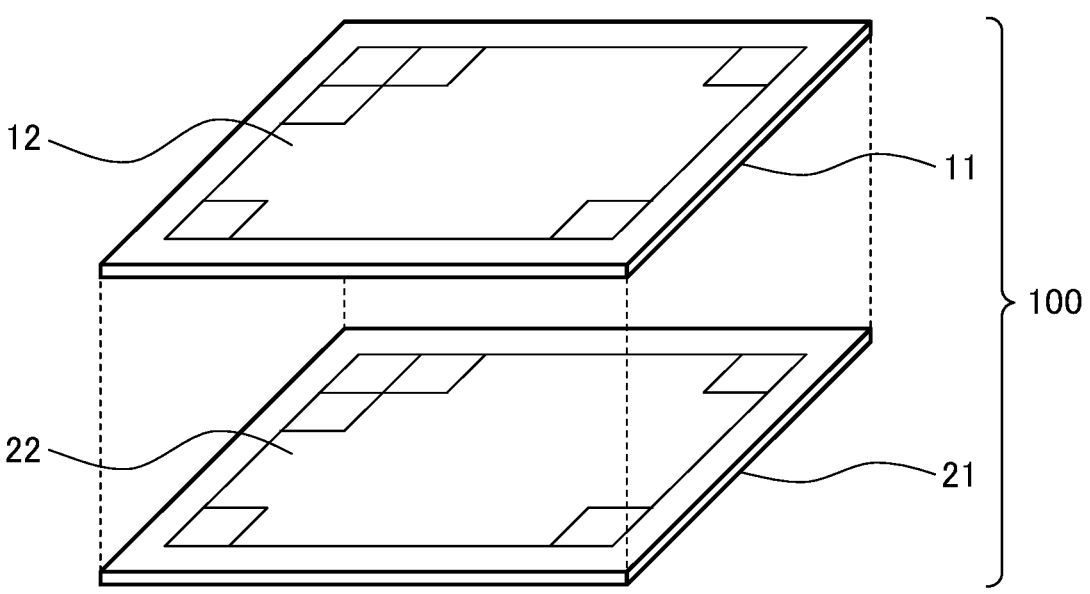
FIG. 1 is a diagram illustrating an example of a configuration of a photoelectric conversion element according to a first embodiment.

FIG. 1 is a diagram illustrating an example of a configuration of a photoelectric conversion element according to a first embodiment. As illustrated in FIG. 1, the photoelectric conversion element 100 according to the first embodiment is a photoelectric conversion element with a so-called stacked structure in which two semiconductor substrates of a sensor substrate 11 and a circuit substrate 21 are stacked and are electrically connected.

However, the photoelectric conversion element 100 may have a so-called non-stacked structure in which elements included in the sensor substrate 11 and elements included in the circuit substrate 21 are arranged in a common substrate layer. The sensor substrate 11 includes a pixel area 12. The circuit substrate 21 includes a circuit area 22 that processes signals detected in the pixel area 12.

Figure 2:
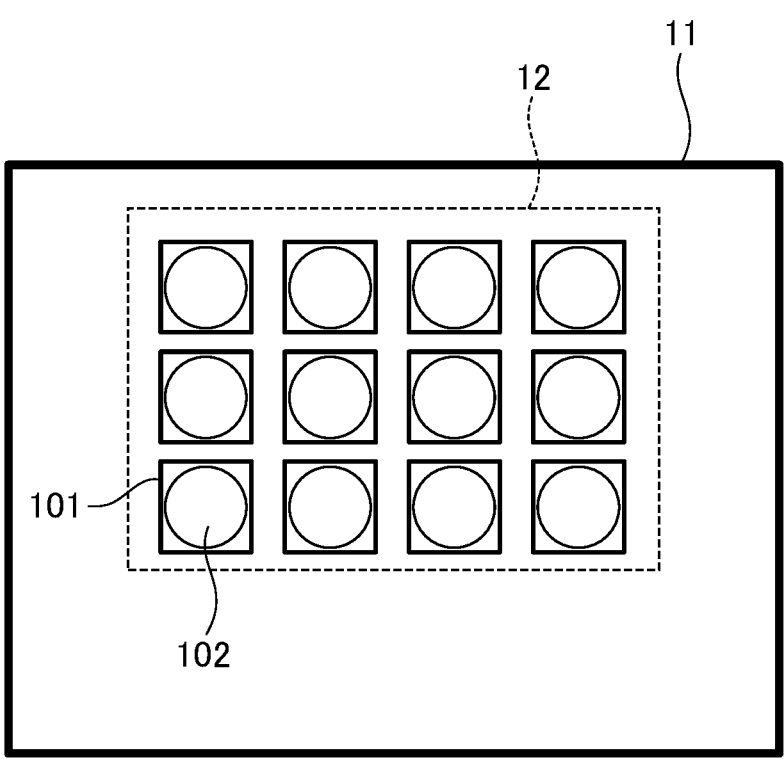
FIG. 2 is a diagram illustrating an example of a configuration of a sensor substrate according to the first embodiment.

FIG. 2 is a diagram illustrating an example of a configuration of the sensor substrate according to the first embodiment, where the pixel area 12 of the sensor substrate 11 includes a plurality of pixels 101 which are arranged in a two-dimensional shape to form a plurality of rows and a plurality of columns. Each pixel 101 includes a photoelectric conversion element 102 including an avalanche photodiode (hereinafter referred to as an APD). The number of rows and the number of columns in a pixel array constituting the pixel area 12 are not limited to the example illustrated in FIG. 2.

Figure 3:
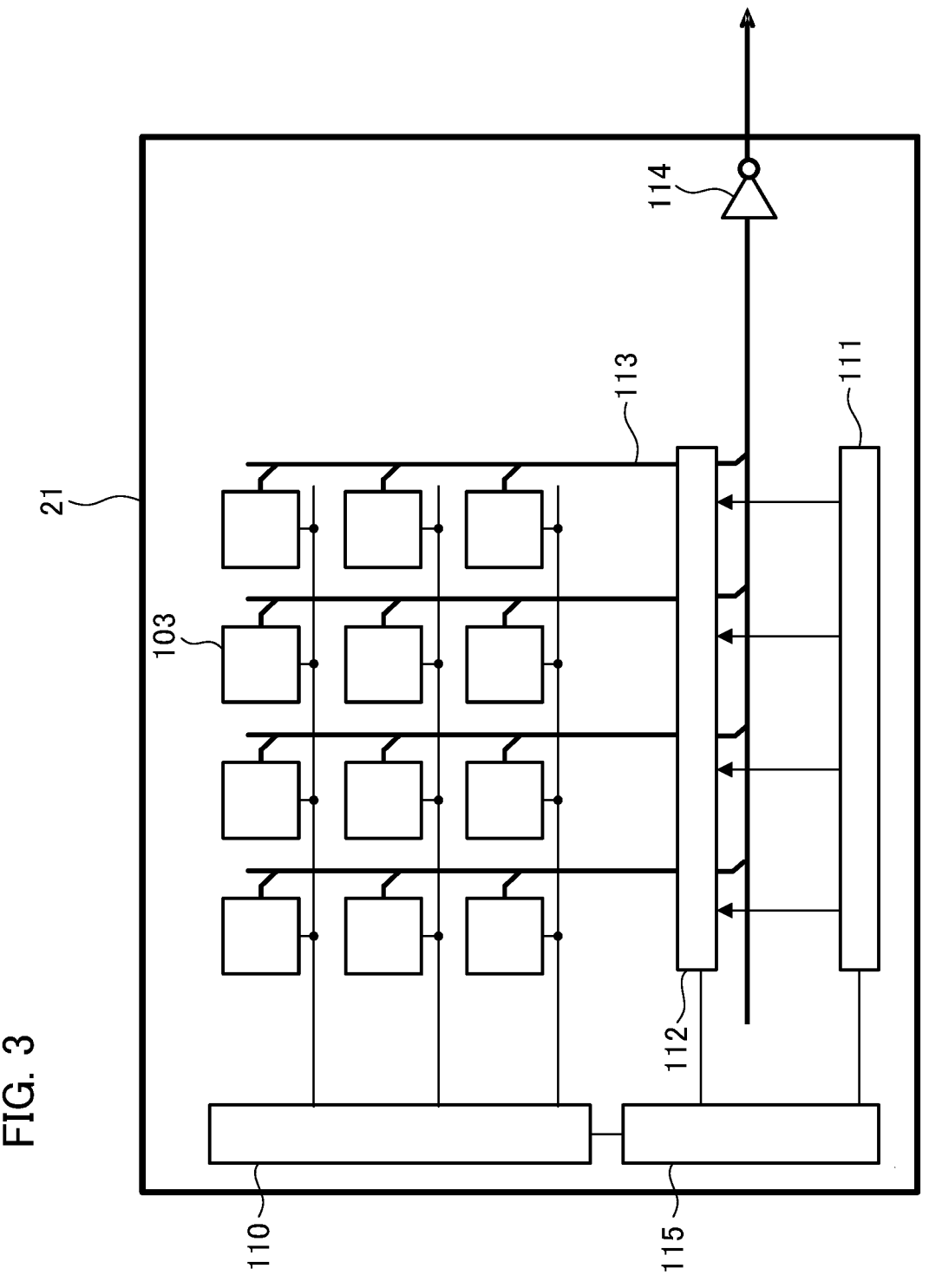
FIG. 3 is a diagram illustrating an example of a configuration of a circuit substrate according to the first embodiment.

FIG. 3 is a diagram illustrating an example of a configuration of the circuit substrate according to the first embodiment. The circuit substrate 21 includes a signal processing circuit 103 that processes electric charges photoelectrically converted by the photoelectric conversion element 102 illustrated in FIG. 2, a reading circuit 112, a control pulse generating unit 115, a horizontal scanning circuit unit 111, a vertical signal line 113, and a vertical scanning circuit unit 110.

The vertical scanning circuit unit 110 is supplied with a control pulse from the control pulse generating unit 115 and sequentially supplies the control pulse to a plurality of pixels of each row. A logical circuit such as a shift register or an address recorder is used for the vertical scanning circuit unit 110.

A signal output from the photoelectric conversion element 102 of each pixel is processed by the corresponding signal processing circuit 103. The signal processing circuit 103 includes a counter or a memory, and a digital value is stored in the memory.

The horizontal scanning circuit unit 111 supplies a control pulse for sequentially selecting columns to the signal processing circuits 103 to read signals from the memories of the pixels storing the digital signals. Signals of the selected column are output from the signal processing circuits 103 of the pixels in the row selected by the vertical scanning circuit unit 110 to the vertical signal line 113. The signals output to the vertical signal line 113 are output outside of the photoelectric conversion element 100 via an output circuit 114.

As illustrated in FIGS. 2 and 3, a plurality of signal processing circuits 103 are disposed below a plurality of pixel areas 12. The vertical scanning circuit unit 110, the horizontal scanning circuit unit 111, the reading circuit 112, the output circuit 114, and the control pulse generating unit 115 are disposed below areas between edges of the sensor substrate 11 and the pixel area 12.

That is, the sensor substrate 11 includes the pixel area 12 and a non-pixel area disposed around the pixel area 12. The vertical scanning circuit unit 110, the horizontal scanning circuit unit 111, the reading circuit 112, the output circuit 114, and the control pulse generating unit 115 are disposed below the non-pixel area.

Disposal of the vertical signal line 113 and disposal of the reading circuit 112 and the output circuit 114 are not limited to the example illustrated in FIG. 3. For example, the vertical signal line 113 may be disposed to extend in the row direction, and the reading circuit 112 may be disposed before the vertical signal line 113 extends.

The function of the signal processing circuit does not need to be provided for each of the photoelectric conversion elements, and a single signal processing circuit may be shared by a plurality of photoelectric conversion elements and configured to sequentially process signals.

Figure 4:
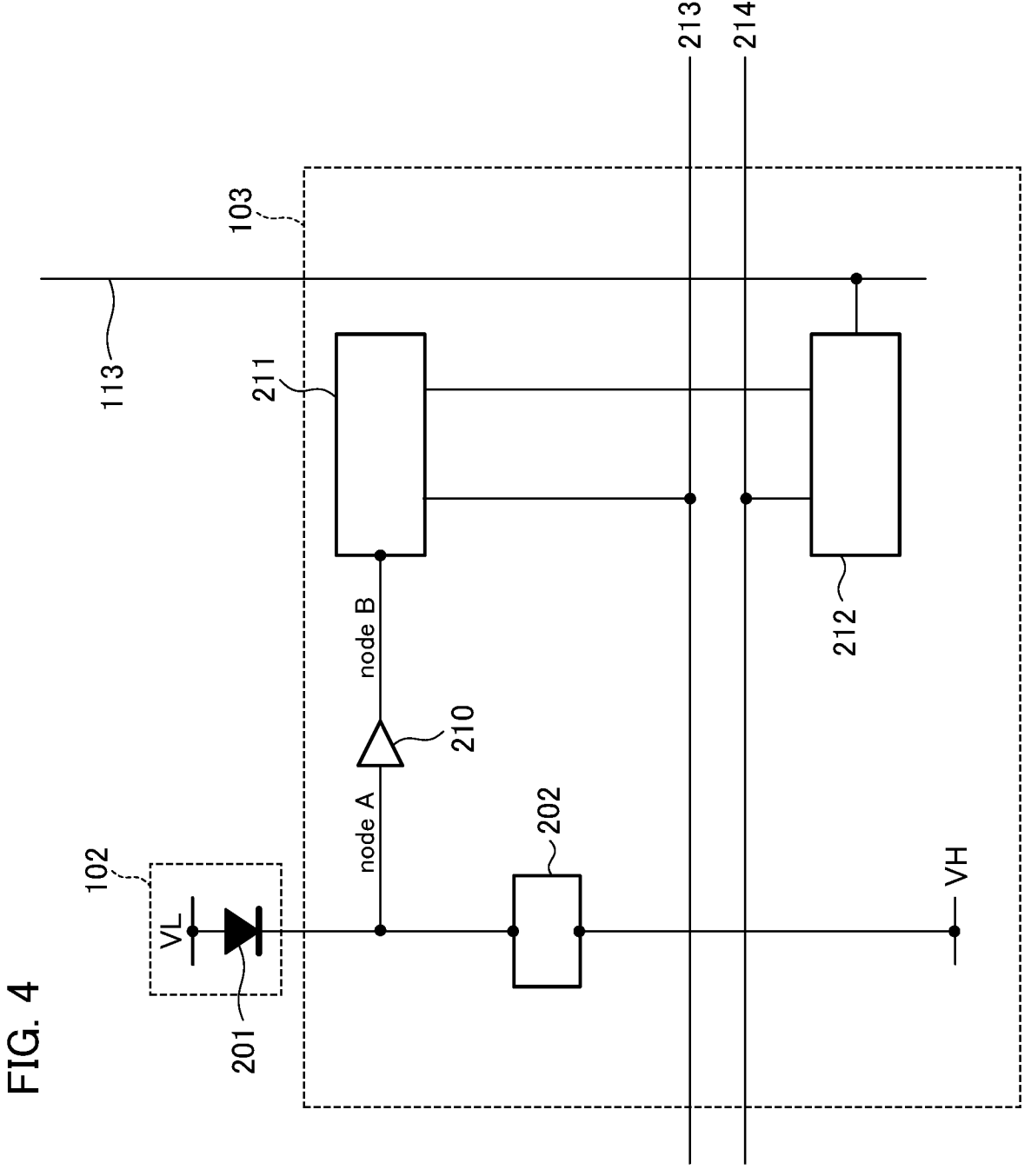
FIG. 4 is a diagram illustrating an example of a configuration of an equivalent circuit of a signal processing circuit corresponding to a pixel of the photoelectric conversion element according to the first embodiment.

FIG. 4 is a diagram illustrating an example of a configuration of an equivalent circuit of the signal processing circuit corresponding to a pixel of the photoelectric conversion element according to the first embodiment, where a pixel 101 and an equivalent circuit of the signal processing circuit 103 corresponding to the pixel 101 are illustrated.

The photoelectric conversion element 100 includes an avalanche photodiode (APD) 201, and the APD 201 generates charge pairs corresponding to incident light through photoelectric conversion. An anode of the APD 201 is connected to a power supply line for supplying a drive voltage VL.

A cathode of the APD 201 is connected to a power supply line for supplying a drive voltage VH higher than the drive voltage VL via a quench element 202. The anode and the cathode of the APD 201 are supplied with a reverse bias voltage VR for allowing the APD 201 to perform an avalanche multiplication operation. Here, the reverse bias voltage VR is calculated by Expression 1.

$$VR = VL - VH \qquad \text{(Expression 1)}$$

By supplying this reverse bias voltage VR, charges generated by incident light cause avalanche multiplication, and an avalanche current is generated.

When the reverse bias voltage VR is supplied, there are a Geiger mode in which a voltage difference between the anode and the cathode is greater than a breakdown voltage and a linear mode in which the voltage difference between the anode and the cathode is a voltage difference close to the breakdown voltage or equal to or less than the breakdown voltage. The APD operating in the Geiger mode is referred to as an SPAD. In the SPAD, the drive voltage VL is, for example, –30 V and the drive voltage VH is, for example, 1 V.

The quench element 202 is connected to the power supply line for supplying the drive voltage VH and the cathode of the APD 201. The quench element 202 serves as a load circuit (a quench circuit) at the time of multiplication of a signal through avalanche multiplication and performs a quench operation of curbing a voltage supplied to the APD 201 to curb the avalanche multiplication.

The quench element 202 performs a recharge operation of returning the voltage supplied to the APD 201 to the drive voltage VH by causing a current corresponding to a voltage drop due to the quench operation to flow.

The signal processing circuit 103 includes a waveform shaping circuit 210, a counter circuit 211, and a selection circuit 212. In FIG. 4, the signal processing circuit 103 includes the waveform shaping circuit 210, the counter circuit 211, and the selection circuit 212, but the signal processing circuit 103 has only to include at least one of the waveform shaping circuit 210, the counter circuit 211, and the selection circuit 212.

The waveform shaping circuit 210 shapes a voltage change of the cathode of the APD 201 which is acquired at the time of detection of photons and outputs a pulse signal. For example, an inverter circuit is used as the waveform shaping circuit 210. In FIG. 4, one inverter is used as the waveform shaping circuit 210, but a circuit in which a plurality of inverters are connected in series may be used or another circuit with a waveform shaping effect may be used.

The counter circuit 211 counts the pulse signal output from the waveform shaping circuit 210 and stores the count value. When a control pulse RES is supplied via a drive line 213, the count value stored in the counter circuit 211 is reset.

The selection circuit 212 is supplied with a control pulse SEL from the vertical scanning circuit unit 110 in FIG. 3 via a drive line 214 in FIG. 4 (not illustrated in FIG. 3). The selection circuit 212 includes, for example, a buffer circuit for outputting a signal and selectively outputs an output signal from the counter circuit 211 of the corresponding pixel to the vertical signal line 113 in response to the control pulse SEL.

In FIG. 4, the output signal is switched by the selection circuit 212, but a switch such as a transistor may be provided between the quench element 202 and the APD 201 or between the photoelectric conversion element 102 and the signal processing circuit 103 to switch an electrical connection. Similarly, supply of the drive voltage VH or the drive voltage VL to the photoelectric conversion element 102 may be electrically switched using the switch such as a transistor.

Figure 5:
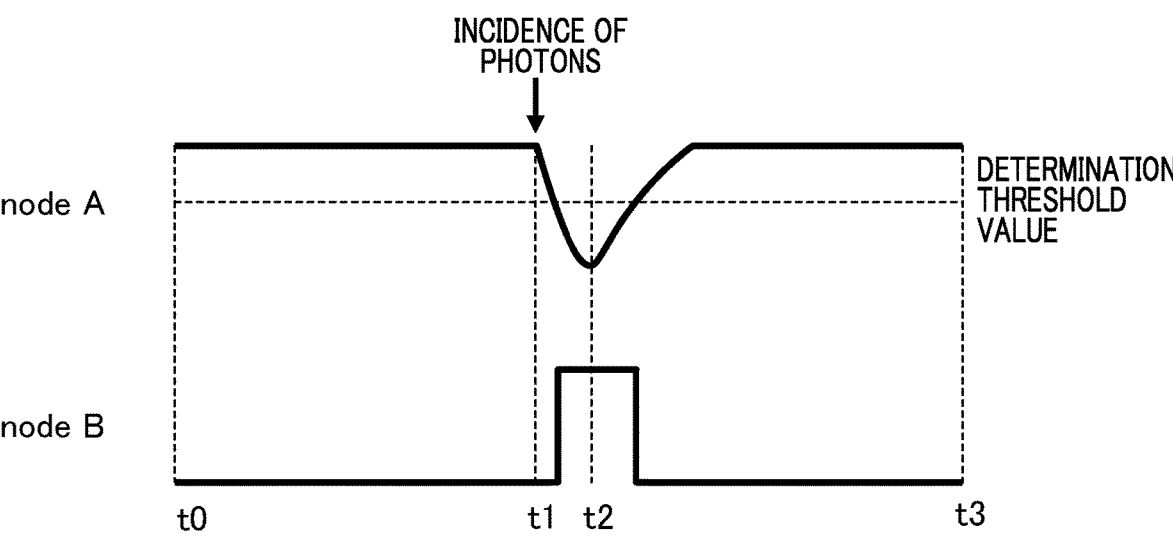
FIG. 5 is a diagram schematically illustrating a relationship between an operation of an APD 201 and an output signal according to the first embodiment.

FIG. 5 is a diagram schematically illustrating a relationship between the operation of the APD 201 and the output signal according to the first embodiment, where an input side of the waveform shaping circuit 210 is defined as node A and an output side thereof is defined as node B. From time t0 to time t1, a potential difference of VH–VL is applied to the APD 201.

When photons are incident on the APD 201 at time t1, avalanche multiplication occurs in the APD 201, an avalanche multiplication current flows in the quench element 202, and the voltage of node A drops.

When the voltage drop increases and the potential difference applied to the APD 201 decreases, avalanche multiplication of the APD 201 stops at time t2, and the voltage level of node A does not drop by a predetermined value or more.

Thereafter, between time t2 to time t3, a current for complementing the voltage drop from the drive voltage VL flows in node A, and node A is statically determined to the original potential level at time t3. At this time, a part in which an output waveform is equal to or less than a predetermined determination threshold value in node A is shaped by the waveform shaping circuit 210, and a pulse signal is output from node B.

Since the breakdown voltage of the APD 201 has temperature dependency, it is preferable that the reverse bias voltage VR be set in cooperation with the temperature. Accordingly, it is preferable to sense the temperature of the photoelectric conversion element 100 and to correct the reverse bias voltage VR based on the temperature dependency of the breakdown voltage.

Figure 6:
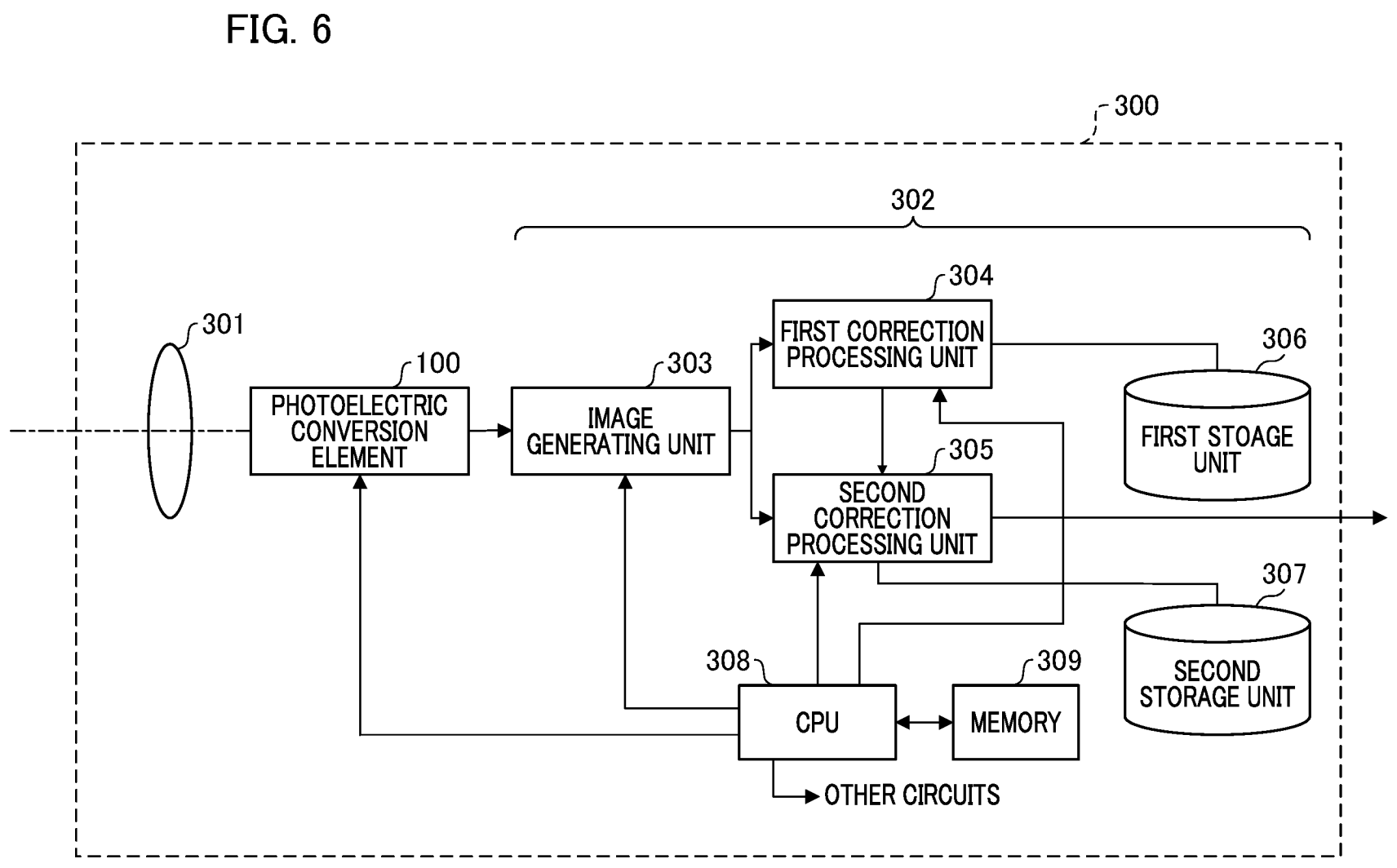

FIG. 6 is a functional block diagram illustrating an example of a configuration of the imaging device according to the first embodiment. Some of functional blocks illustrated in FIG. 6 are realized by causing a CPU 308 which is a computer included in the imaging device 300 to execute a computer program stored in the memory 309 which is a recording medium.

However, some or all of the functional blocks may be realized by hardware. A dedicated circuit (ASIC), a processor (a reconfigurable processor or a DSP), or the like can be used as the hardware. The functional blocks illustrated in FIG. 6 may not be built in the same housing and may be constituted by different devices connected to each other via a signal line.

The imaging device 300 includes the photoelectric conversion element 100 described above with reference to FIGS. 1 to 5, an imaging optical system 301, and a signal processing unit 302 that processes an image signal acquired by the photoelectric conversion element 100. The photoelectric conversion element 100 includes avalanche diodes for photoelectrically converting an optical image. In the first embodiment, the photoelectric conversion element 100 is a so-called monochromatic sensor in which each pixel does not include a color filter.

The signal processing unit 302 includes an image generating unit 303 that generates a first image from image signals acquired by the photoelectric conversion elements, a first correction processing unit 304, a second correction processing unit 305, a CPU 308 which is a computer, and a memory 309.

The signal processing unit 302 includes a first storage unit 306 which is a storage unit storing first array data on first characteristic information of the photoelectric conversion element 100. The signal processing unit 302 includes a second storage unit 307 which is a storage unit storing second array data on second characteristic information of the photoelectric conversion element 100. The second characteristic information is characteristic information for determining a crosstalk region of a specific pixel (a defective pixel) to neighboring pixels.

The first characteristic information is information on crosstalk characteristics between pixels due to an avalanche luminescence phenomenon of the photoelectric conversion element 100. The first storage unit 306 may download the first characteristic information (first array data or the like) from an external server or the like and temporarily store the first characteristic information.

On the other hand, the second characteristic information is data set based on the first characteristic information by simplifying the first characteristic information. The second storage unit 307 may download the second characteristic information (second array data or the like) from an external server or the like and temporarily store the first characteristic information.

At least two of the first storage unit 306, the second storage unit 307, and the memory 309 may be integrally configured. The CPU 308 serves as a control unit that controls operations of the constituents of the imaging device 300 as a whole based on a computer program stored in the memory 309 which is a storage medium.

The first correction processing unit 304 corrects linearity of the first image by performing correction of erroneous counting (a first correction process) based on the first characteristic information (the first array data or the like) of the photoelectric conversion element 100.

FIG. 7 is a diagram illustrating an example of an occurrence probability distribution of erroneous counting between neighboring pixels of the photoelectric conversion element 100 as first array data, where an example of the first array data corresponding to the first characteristic information of the photoelectric conversion element 100 is illustrated. The first array data (the first characteristic information) illustrated in FIG. 7 is stored in the first storage unit 306, and correction by the first correction processing unit 304 is performed using the first array data.

The first array data which is the first characteristic information may be stored as a table or a function in the first storage unit 306 or the like.

On the other hand, a correction target in the second correction processing unit 305 is a pixel having a white defect shape due to electric charges cross-talking from a luminescence defect of a defective pixel, and a defect correcting process is performed on a pixel in which a white defect level (a correction level) due to crosstalk is equal to or greater than a predetermined value.

FIG. 8 is a diagram illustrating an example of second array data in which threshold values for determining whether a defect correcting process is necessary for neighboring pixels according to a state of a pixel of interest are stored, where an example of the second array data set based on the first characteristic information of the photoelectric conversion element 100 is illustrated. The second array data (the second characteristic information) illustrated in FIG. 8 is stored in the second storage unit 307, and correction by the second correction processing unit 305 is performed using the second array data.

The second correction processing unit 305 performs a second correction process for performing pixel interpolation (a defect correcting process) of a signal of a defective pixel using information such as information of the first image and the second characteristic information (the second array data or the like) of the photoelectric conversion element 100. The second characteristic information on crosstalk characteristics between pixels due to an avalanche luminescence phenomenon of the photoelectric conversion element may be array information or a function.

The second array data or the like which is the second characteristic information may also be stored as a table or a function in the second storage unit 307 or the like.

As described in Document 1, when a pixel is an avalanche photodiode, erroneous counting between neighboring pixels, that is, crosstalk between neighboring pixels (hereinafter referred to as luminescent crosstalk), occurs due to an avalanche luminescence phenomenon.

An influence of photons incident on one pixel on neighboring pixels is determined as a probability that luminescent crosstalk will occur. Since an occurrence probability of luminescent crosstalk is determined according to a pixel structure of the photoelectric conversion element, the occurrence probability of luminescent crosstalk can be predicted based on the pixel structure of the photoelectric conversion element.

Accordingly, with the imaging device 300 according to the first embodiment, it is possible to improve image quality by performing signal processing of curbing an influence of erroneous counting using information on the occurrence probability of luminescent crosstalk.

Figure 9:
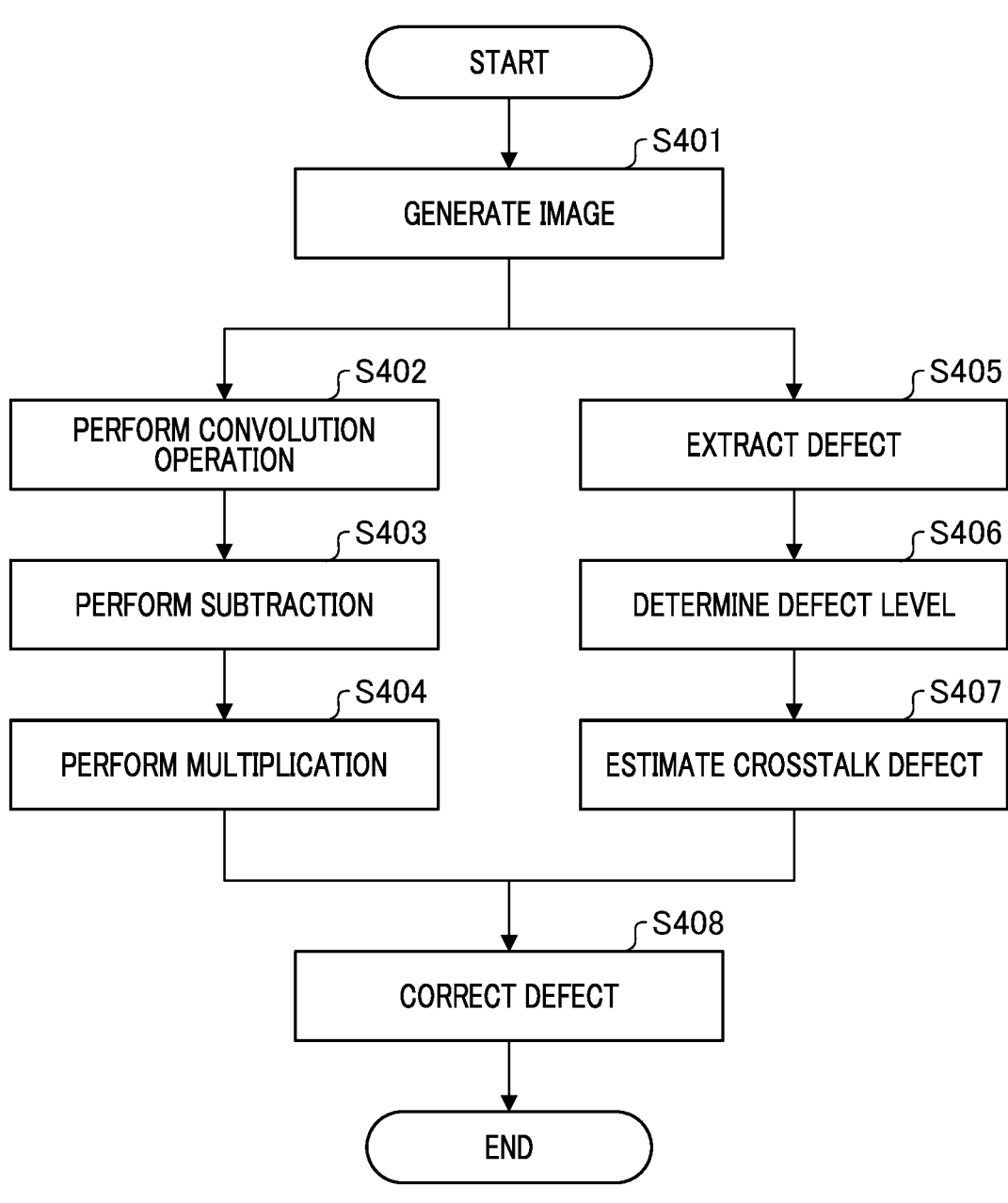
FIG. 9 is a flowchart illustrating an example of an image correcting method in the imaging device according to the first embodiment.

FIG. 9 is a flowchart illustrating an example of an image correcting method of the imaging device according to the first embodiment. Operations of steps of a method of controlling an imaging device which is illustrated in the flowchart of FIG. 9 are periodically performed by causing the CPU 308 which is a computer in the imaging device 300 to execute a computer program stored in the memory 309.

First, in Step S401 (an image generating step), the image generating unit 303 generates a first image based on a signal acquired by the photoelectric conversion element 100. Thereafter, the process flow branches to a first correction process and a second correction process.

The first correction process will be first described. In Step S402, the first correction processing unit 304 performs a convolution operation for convoluting third array data prepared based on the first array data on the first image generated by the image generating unit 303 and generates a second image.

Since the occurrence probability of luminescent crosstalk can be predicated as described above, the second image becomes a signal indicating erroneous counting occurring due to luminescent crosstalk by performing the convolution operation thereon. The first characteristic information (the first array data or the like) can be acquired from the first storage unit 306, an external server, or the like. The third array data may be stored as a table or a function in the first storage unit 306 or the like. Here, Step S402 serves as an acquisition step (an acquisition unit) of acquiring first characteristic information of the photoelectric conversion element.

Then, the first correction processing unit 304 subtracts the second image from the first image in Step S403 and generates a third image by multiplying the subtraction result by a gain scale factor (a gain multiple) for changing an image level to a desired level in Step S404.

Since the second image is a signal indicating erroneous counting due to luminescent crosstalk as described above, the third image is an image which is obtained by restoring a signal obtained when erroneous counting due to luminescent crosstalk has not occurred and multiplying the signal by the gain multiple.

Here, Step S402 and Step S403 serve as a first correction processing step of performing the first correction process for correcting linearity of the first image using the first characteristic information (the first array data).

Figure 10:
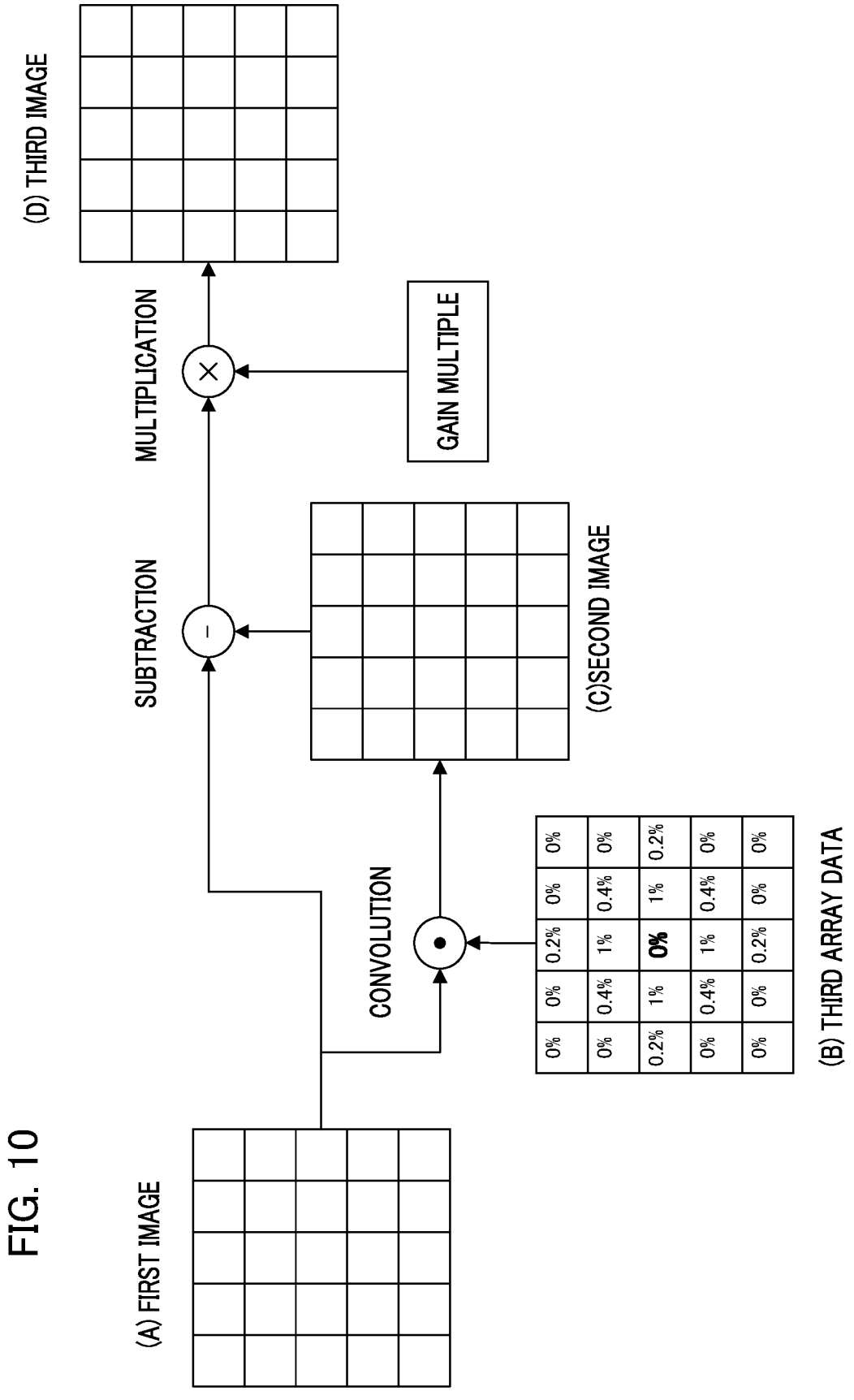
FIG. 10 is a diagram illustrating a first correction process according to the first embodiment.

FIG. 10 is a diagram illustrating the first correction process according to the first embodiment, where (A) illustrates the first image, (B) illustrates the third array data, (C) illustrates the second image, and (D) illustrates the third image. The third array data used in Step S402 is data in which the value of the pixel (the central pixel) in the first array data illustrated in FIG. 7 is replaced with 0.

Here, the third array data may be different from that illustrated in (B) of FIG. 10 as long as it is based on the first array data. In Step S402, the first image and the third array data may be subjected to Fourier transform instead of the convolution operation and then a product thereof may be calculated.

That is, the first correction process is a process of subtracting a result of a predetermined operation (such as a convolution operation or Fourier transform and multiplication) using data based on the first characteristic information of the photoelectric conversion element and the first image from the first image.

Subsequently, the second correction process will be described. The second correction processing unit 305 corrects a defective pixel. As described above, when a pixel is an avalanche photodiode, an influence of a defective pixel propagates to neighboring pixels due to luminescent crosstalk.

Such a defect is referred to as a cluster defect. The second correction processing unit improves image quality by performing signal processing of curbing an influence of erroneous counting due to a cluster defect using information of the occurrence probability of luminescent crosstalk.

Figure 11:
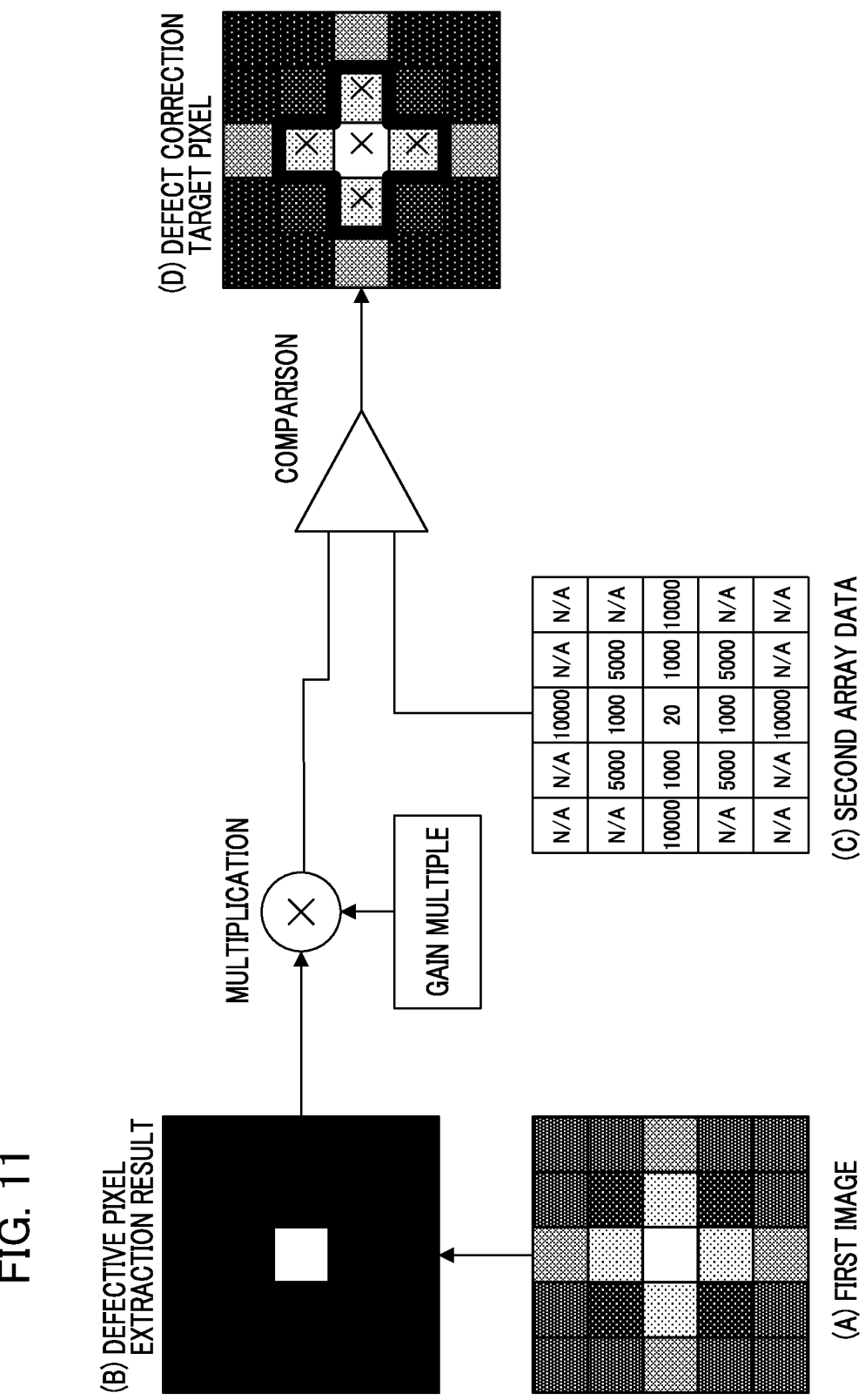
FIG. 11 is a diagram illustrating a second correction process according to the first embodiment.

First, in Step S405, a pixel in which an output level is higher by a predetermined value or more than those of neighboring pixels in the first image generated by the image generating unit 303 is extracted as a defective pixel. FIG. 11 is a diagram illustrating the second correction process according to the first embodiment.

(A) of FIG. 11 illustrates the first image, and (B) illustrates an extraction result of the defective pixel extracted in Step S404. FIG. 12 is a diagram illustrating relative coordinates of pixels on the imaging device and illustrating a relative relationship between pixels.

That is, an average neighboring pixel value is calculated from pixel values of neighboring pixels $(-1, -1)$, $(0, -1)$, $(1,$ −1), (−1, 0), (1, 0), (−1, 1), (0, 1), and (1, 1). When a difference value obtained by subtracting the pixel value of the neighboring pixels from a pixel value of a pixel of interest (0, 0) is equal to or greater than a predetermined value, the pixel is set as a defective pixel. The difference value is set as a defective pixel value. In this way, the neighboring pixels include pixels vertically, horizontally, and obliquely adjacent to a target pixel.

In Step S406, a defect level is determined. In determining a defect level, a gain-multiple defective pixel value is calculated by multiplying the defective pixel value by the same gain scale factor as used in Step S404 of the first correction process.

Then, it is determined to what defect level in a plurality of defect level determination threshold values illustrated in the left part of FIG. 13 the gain-multiple defective pixel value corresponds. FIG. 13 is a diagram illustrating an example of defect level determination threshold values at a predetermined gain scale factor.

When the gain scale factor is equal to or greater than a predetermined value, it is preferable to increase the defect level determination threshold value with an increase of the gain scale factor in order to avoid excessive enlargement of a defect correction target range.

In Step S407, a crosstalk defect is estimated. That is, the defect level determination threshold value corresponding to the defect level determined in Step S406 is compared with elements of the second array data illustrated in FIG. 8, and a pixel of which a value in the second array data is equal to or less than the defect level determination threshold value corresponding to the defect level is determined as a defect correction target pixel. That is, a defect correction target is determined based on (the defect level determination threshold value corresponding to) the defect level and the second characteristic information.

In (D) of FIG. 11, pixels (defect correction target pixels) of which a value in the second array data is equal to or less than, for example, the defect level determination threshold value corresponding to defect level 3 are referred to by mark x. A pixel of which a value in the second array data is equal to or less than the defect level determination threshold value corresponding to the defect level is also referred to as a pixel in which an estimated crosstalk value around the interpolation target pixel is equal to or greater than a predetermined first threshold value.

Then, in Step S408, a defect is corrected. Specifically, a pixel value of the defect correction target pixel estimated in Step S407 out of the pixels of the third image generated in Step S404 is interpolated using a plurality of pixel values around the defect correction target pixel. That is, the defect correction target pixel is estimated based on the second array data, and a pixel value of the third image corresponding to the estimated defect correction target pixel is interpolated using a plurality of pixel values of the neighboring pixels.

The interpolation process can be performed using a result of application of a median filter to a plurality of pixels other than pixels of which a value in the second array data is equal to or less than a defect level around an interpolation target pixel.

In this way, Steps S405 to S408 serve as a second correction processing step of performing the second correction process for performing pixel interpolation based on both the second characteristic information (the second array data) and information of the first image.

The kernel size of the median filter has only to be equal to or greater than 3×3, but since there is a likelihood that an influence of a defective pixel will propagate to neighboring pixels, it is preferable that the kernel size be equal to or greater than 5×5.

The size of the median filter may be changed according to the proportion of pixels in which an estimated crosstalk value around an interpolation target pixel is equal to or greater than the first threshold value. That is, the kernel size may be set to increase as the proportion of pixels of which a value in the second array data is equal to or less than the defect level around the interpolation target pixel increases.

Accordingly, it is possible to increase the number of pixels which can be used for correction (pixels of which a value in the second array data is greater than the defect level) and to improve interpolation accuracy. A bilateral filter, a Gaussian filter, or the like may be used instead of the median filter.

The first array data which is the first characteristic information may have one dimension or two dimensions as long as it includes two or more pieces of data and is preferably two-dimensional array data as illustrated in FIG. 7. In consideration of symmetry of a crosstalk probability, it is preferable that the matrix include odd-numbered rows and odd-numbered columns and be vertically and horizontally symmetric with respect to the center.

Since a value of the crosstalk probability increases toward the pixel, the crosstalk matrix has a distribution that includes a peak value at the center and that monotonously changes toward the periphery. Specifically, when one row or one column of the crosstalk matrix which is two-dimensional array data is taken as one-dimensional data, the one-dimensional data has a distribution that monotonously decreases from a peak value at the center to both data ends.

That is, one-dimensional data corresponding to at least one row or one column of two-dimensional array data has a peak value at the center. Another one-dimensional data that shares the peak value of the taken one-dimensional data and that is arranged in a direction crossing the one-dimensional data has a distribution that monotonously decreases from the peak value to data ends.

Second Embodiment

An imaging device according to a second embodiment is different from the imaging device according to the first embodiment in that the photoelectric conversion element is a so-called color sensor including a plurality of pixels with different spectral characteristics. In the following description, an RGGB Bayer array type color sensor will be exemplified.

FIG. 14 is a diagram illustrating an example of a Bayer array of color filters on imaging elements, where an RGGB Bayer array type color filter is exemplified in the second embodiment. That is, in the second embodiment, a color filter is provided in front of each pixel of the photoelectric conversion element.

That is, it is assumed that one of R, G, and B color filters is disposed in front of each pixel, for example, the color filters are disposed in the order of R, G, R, and G in a predetermined row, and the color filters are disposed in the order of G, B, G, and B in neighboring rows thereof.

Figure 15:
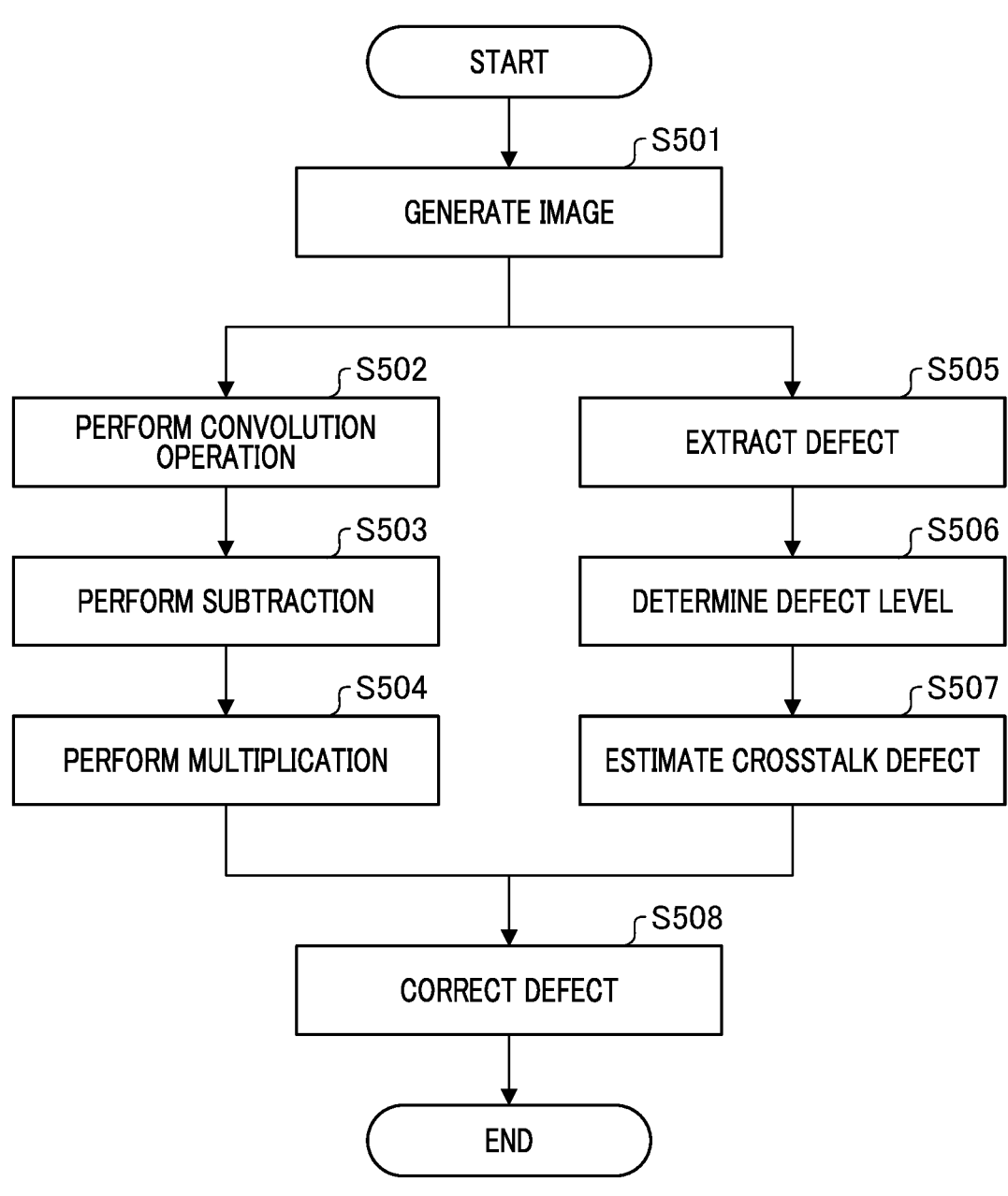
FIG. 15 is a flowchart illustrating an example of an image correcting method in an imaging device according to a second embodiment.

FIG. 15 is a flowchart illustrating an example of an image correcting method in the imaging device according to the second embodiment. Operations of steps of the flowchart illustrated in FIG. 15 are periodically performed by causing a computer in the imaging device 300 to execute a computer program stored in a memory. Differences from the flowchart illustrated in FIG. 9 will be mainly described below.

In Step S501, similarly to Step S401, the image generating unit 303 generates a first image. Thereafter, similarly to FIG. 9, the process flow branches to a first correction process and a second correction process. Step S502 (convolution operation), Step S503 (subtraction), and Step S504 (multiplication) for performing the first correction process after branching are the same as in FIG. 9.

The probability of luminescent crosstalk is determined according to a structure in a substrate in which the avalanche photodiodes are formed, and an influence of color filters disposed on the substrate can be ignored. Accordingly, in both the monochromatic sensor according to the first embodiment and the color sensor according to the second embodiment, the occurrence probability of luminescent crosstalk is the same, and the same correction can be performed in the first correction process.

On the other hand, since color filters having different spectral characteristics are provided in neighboring pixels, the neighboring pixels and the pixel of interest are different in signal level in general. Accordingly, extraction of a defect in Step S505 is performed in comparison with the signal levels of pixels having the same color near the pixel of interest instead of the neighboring pixels. That is, in the second embodiment, extraction of a defect is performed using pixels having the same color as a target pixel and vertically, horizontally, and obliquely adjacent to the target pixel as the neighboring pixels.

In a Bayer array color filter illustrated in FIG. 14, R and G are repeated in each row or each column, and G and B are repeated in a neighboring row or column. That is, when (0, 0) in FIG. 12 is a pixel of interest, neighboring pixels of the same color are (−2, −2), (0, −2), (2, −2), (−2, 0), (2, 0), (−2, 2), (0, 2), and (2, 2).

Accordingly, in Step S505, a defective pixel is extracted similarly to Step S405 by comparing the signal level of the pixel of interest (0, 0) with those of neighboring pixels of the same color.

Defect level determination of Step S506 and crosstalk defect estimation of Step S507 are the same as in FIG. 9. This is because crosstalk characteristics between pixels are not affected by whether there are color filters.

However, interpolation of a defect in Step S508 is different from Step S408. Specifically, in Step S508, an interpolation process is performed for each of pixels having different spectral characteristics, that is, using signals from pixels of the same color (spectral characteristics). Specifically, a median filer can be applied for each of pixels having different spectral characteristics using pixels of which a value in the third array data is equal to or less than a predetermined threshold value near the interpolation target pixel.

In a Bayer array color sensor, since a pixel of the same color (spectral characteristics) is disposed every other pixel in each row and each column, an influence of a cluster defect on the pixels having the same spectral characteristics is smaller than that in the monochromatic sensor. Accordingly, the kernel size of the median filter can be equal to or larger than 3×3.

Figure 16:
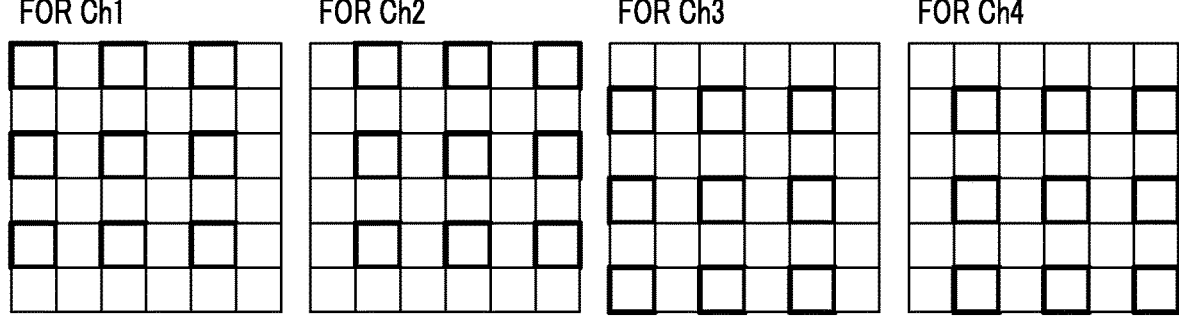
FIG. 16 is a diagram illustrating a second correction process according to the second embodiment.

FIG. 16 is a diagram illustrating the second correction process according to the second embodiment. As illustrated in FIG. 16, 4 types of seventh images to which the median filter is applied for each of pixels having different spectral characteristics (for the pixels having the same spectral characteristics) are generated for the first image. In FIG. 16, Ch1, Ch2, Ch3, and Ch4 indicate, for example, pixels of R, G, G, and B.

Then, a pixel with an output in which a difference between the first image and the seventh image is equal to or greater than a second threshold value is extracted as a defective pixel, and the difference between the first image and the seventh image is set as an output level of the defective level. In FIG. 16, the kernel size of the median filter is 3×3, but the kernel size may be greater. In this way, a defective pixel may be extracted by comparing an output of each pixel with outputs of neighboring pixels for each of pixels having different spectral characteristics using the first image.

In a color sensor, the third array data which is used for the convolution operation of Step S502 may change according to the colors. Similarly, the second array data which is used for Step S507 may change according to the colors.

In a color sensor, since there is no difference in crosstalk probability between the colors but the signal levels of the pixels having different colors change according to the colors of a subject, there is a color which can be easily affected by erroneous counting due to crosstalk.

For example, when the photoelectric conversion element is an RGGB Bayer array type color sensor, luminance of B pixels in a general subject is the lowest and luminance of G pixels is the highest. Accordingly, B pixels can be most easily affected by erroneous counting due to crosstalk, and G pixels can be most difficultly affected by the erroneous counting.

As the size of the third array data increases, an influence of erroneous counting due to crosstalk can be more reduced, but it can be more easily affected by a difference in luminescent crosstalk probability due to manufacturing irregularity. Accordingly, it is preferable that the third array data have a minimum size with which the influence of erroneous counting due to crosstalk can be curbed.

Accordingly, the size of the third array data may differ depending on pixels having different spectral characteristics. For example, when the photoelectric conversion element is a color sensor using RGB color filters, the size of the third array data for B pixels which is used in S502 is preferably larger than that for G pixels.

Third Embodiment

In the first embodiment and the second embodiment, a defective pixel may be erroneously detected due to a pattern on a subject including a pixel of interest and neighboring pixels. FIGS. 17A to 17C are diagrams illustrating an example in which a defective pixel is erroneously detected.

FIG. 17A is a diagram illustrating a monochromatic boundary in which pixel values of a row including a pixel of interest and rows above the row are 0 and pixel values of rows below the row including the pixel of interest are 4000. FIG. 17B is a diagram illustrating a monochromatic boundary in which pixel values above the row including the pixel of interest and pixel values of the row including the pixel of interest and rows below the row are 4000, and FIG. 17C is a diagram illustrating a white line pattern in which pixel values of the row including the pixel of interest are 4000 and pixel values of the other rows are 0.

An average value of 8 neighboring pixels of the center pixel of interest is 1500 in FIG. 17A, 2500 in FIG. 17B, and 100 in FIG. 17C. Accordingly, a difference from the pixel of interest is 0−1500=−1500 in FIG. 17A, 4000−2500=1500 in FIG. 17B, and 4000−1000=3000 in FIG. 17C.

Accordingly, when the average value of 8 neighboring pixels of the pixel of interest is used as a reference value and a defect extraction threshold value corresponding to defect level 1 is 1024 as illustrated in FIG. 13, the pixel is determined as a defective pixel and is corrected in FIGS. 17B and 17C. Therefore, the present embodiment provides a configuration for avoiding the erroneous counting.

Figure 18:
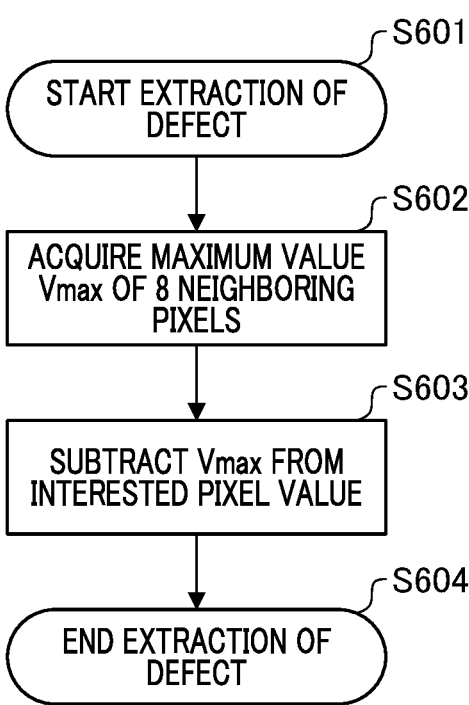
FIG. 18 is a flowchart illustrating an example of a defect extracting process of Step S505 according to a third embodiment.

FIG. 18 is a flowchart illustrating an example of a defect extracting process of Step S505 according to the third embodiment. Operations of Steps in the flowchart illustrated in FIG. 18 are performed by causing a computer in the imaging device 300 to execute a computer program stored in a memory.

When extraction of a defect is started in Step S601, a maximum value Vmax of 8 neighboring pixels is acquired in Step S602. In Step S603, a defective pixel value is acquired by subtracting the maximum value Vmax from an interested pixel value, and the extraction of a defect is completed in Step S604.

When extraction of a defect is performed in this process, Vmax in the examples illustrated in FIGS. 17B and 17C is 4000 and the difference from the pixel of interest is 4000−4000=0, and thus the pixel of interest is not determined to be a defective pixel. In this way, according to the third embodiment, the first defective pixel value is acquired by subtracting a maximum pixel value of pixel values of a plurality of neighboring pixels of a target pixel from a pixel value of the target pixel.

Fourth Embodiment

In the imaging devices according to the first to third embodiments, noise of a white defect shape may occur, for example, in a reading circuit other than the pixel area. This defect has a high signal level, but crosstalk toward neighboring pixels does not occur.

FIG. 19A is a diagram illustrating an example of a pixel value distribution when an interested pixel value is 4000 and a defect occurs in the pixel area, and FIG. 19B is a diagram illustrating an example of a pixel value distribution when a defect occurs in a part other than the pixel area. When correction according to the first and second embodiments is performed on an image illustrated in FIG. 19B, defect correction is performed on two neighboring pixels vertically and horizontally adjacent to the pixel of interest and neighboring pixels obliquely adjacent thereto which do not need to be originally corrected in defect.

Figure 20:
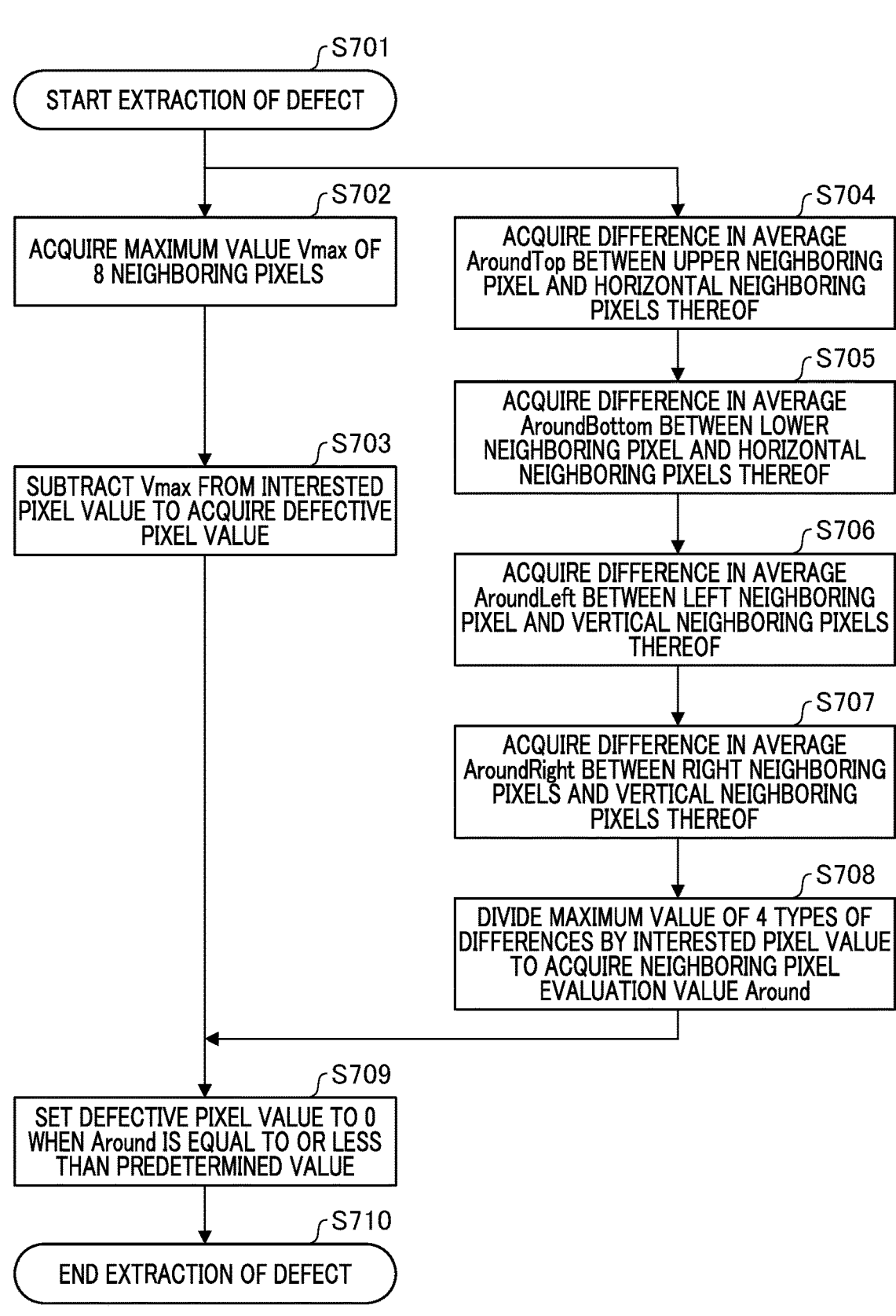
FIG. 20 is a flowchart illustrating an example of operations according to a fourth embodiment.

An excessive correction preventing process for a defect occurring in a part other than the pixel area according to the fourth embodiment will be described below with reference to an example of a monochromatic sensor. FIG. 20 is a flowchart illustrating an example of operations according to the fourth embodiment. The operations of steps in the flowchart illustrated in FIG. 19 are performed by causing a computer in the imaging device 300 to execute a computer program stored in a memory.

The operations of Steps S701 to S703 are the same as the operations of Steps S601 to S603 in FIG. 18 and thus description thereof will be omitted. In Step S704, an average value of neighboring pixels (−1, −1) and (1, −1) horizontally adjacent to a pixel (0, −1) upwardly adjacent to a pixel of interest (0, 0) is calculated, and a difference AroundTop is calculated by subtracting the average value from the pixel value of (0, −1).

In Step S705, an average value of neighboring pixels (−1, 1) and (1, 1) horizontally adjacent to a pixel (0, 1) downwardly adjacent to the pixel of interest (0, 0) is calculated, and a difference AroundBottom is calculated by subtracting the average value from the pixel value of (0, 1).

In Step S706, an average value of neighboring pixels (−1, −1) and (−1, 1) vertically adjacent to a pixel (−1, 0) leftward adjacent to the pixel of interest (0, 0) is calculated, and a difference AroundLeft is calculated by subtracting the average value from the pixel value of (−1, 0).

In Step S707, an average value of neighboring pixels (1, −1) and (1, 1) vertically adjacent to a pixel (1, 0) rightward adjacent to the pixel of interest (0, 0) is calculated, and a difference AroundRight is calculated by subtracting the average value from the pixel value of (1, 0).

In Step S708, a neighboring pixel evaluation value Around is acquired by dividing the maximum value of the differences AroundTop, AroundBottom, AroundLeft, and AroundRight by the interested pixel value.

In Step S709, when the neighboring pixel evaluation value Around is equal to or less than a predetermined value, the pixel of interest is determined not to have a crosstalk defect, and the defective pixel value acquired in Step S703 is replaced with 0. When it is determined in Step S709 that the neighboring pixel evaluation value Around is greater than the predetermined value, the pixel of interest is determined to have a crosstalk defect, the defective pixel value acquired in Step S703 is used without any change, and extraction of a defect is completed in Step S710.

In this way, according to the fourth embodiment, when the second defective pixel value is greater than the determination threshold value and the pixel value of the neighboring pixels are not greater than a predetermined value, the target pixel is not determined to be a defective pixel. Accordingly, regarding such a type of defect that crosstalk does not propagate to neighboring pixels in a monochromatic sensor, it is possible to prevent neighboring pixels from being erroneously corrected in defect.

Fifth Embodiment

In a fifth embodiment of the present invention, an excessive correction preventing process for a defect in a part other than the pixel area in the Bayer array color sensor illustrated in FIG. 14 will be described. The flowchart illustrating these operations is the same as FIG. 20 according to the fourth embodiment, and neighboring pixels with the same color vertically and horizontally adjacent to a pixel of interest are used. The operations will be described below with reference to the drawing.

In Step S704, an average value of neighboring pixels (−1, −2) and (1, −2) obliquely upward adjacent to a pixel (0, −1) upwardly adjacent to a pixel of interest (0, 0) is calculated, and a difference AroundTop is calculated by subtracting the average value from the pixel value of (0, −1).

In Step S705, an average value of neighboring pixels (−1, 2) and (1, 2) obliquely downward adjacent to a pixel (0, 1) downwardly adjacent to the pixel of interest (0, 0) is calculated, and a difference AroundBottom is calculated by subtracting the average value from the pixel value of (0, 1).

In Step S706, an average value of neighboring pixels (−2, −1) and (−2, 1) obliquely leftward adjacent to a pixel (−1, 0) leftward adjacent to the pixel of interest (0, 0) is calculated, and a difference AroundLeft is calculated by subtracting the average value from the pixel value of (−1, 0).

In Step S707, an average value of neighboring pixels (2, −1) and (2, 1) obliquely rightward adjacent to a pixel (1, 0) rightward adjacent to the pixel of interest (0, 0) is calculated, and a difference AroundRight is calculated by subtracting the average value from the pixel value of (1, 0).

In Step S708, a neighboring pixel evaluation value Around is acquired by dividing the maximum value of the differences AroundTop, AroundBottom, AroundLeft, and AroundRight by the interested pixel value.

In Step S709, when the neighboring pixel evaluation value Around is equal to or less than a predetermined value, the pixel of interest is determined not to have a crosstalk defect, and the defective pixel value acquired in Step S703 is replaced with 0. When it is determined in Step S709 that the neighboring pixel evaluation value Around is greater than the predetermined value, the pixel of interest is determined to have a crosstalk defect, the defective pixel value acquired in Step S703 is used without any change, and extraction of a defect is completed in Step S710.

As described above, with the processing according to the fifth embodiment, regarding such a type of defect that crosstalk does not propagate to neighboring pixels in a color sensor, it is possible to prevent neighboring pixels from being erroneously corrected in defect.

Sixth Embodiment

In the first and second embodiments, the first defective pixel value is calculated by subtracting the pixel value of the neighboring pixels of the target pixel from the pixel value of the pixel of interest (the target pixel), and the second defective pixel value is calculated by multiplying the first defective pixel value by a predetermined gain multiple.

A defect level is determined by comparing the second defective pixel value which is a result of multiplication of the same gain as multiplication of the first image signal with the plurality of determination threshold values illustrated FIG. 13.

However, the determination threshold value may change in inverse proportion with the gain multiple. That is, the determination threshold value in FIG. 13 may be changed according to the gain scale factor and be compared with the first defective pixel value to determine a defect level. FIG. 21 is a diagram illustrating an example of a threshold value when the threshold value changes depending on gain scale factors according to a sixth embodiment.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the imaging device or the like through a network or various storage media. Then, a computer (or a CPU, an MPU, or the like) of the imaging device or the like may be configured to read and execute the program. In such a case, the program and the storage medium storing the program configure the present invention.

The present invention may be realized, for example, using at least one processor or circuit configured to function of the embodiments explained above. The present invention may be realized in a distributed manner using a plurality of processors.

This application claims the benefit of Japanese Patent Application No. 2023-027211, filed on Feb. 24, 2023, which is hereby incorporated by reference herein in its entirety.

What is claimed is:

1. An imaging device comprising:
a photoelectric conversion element including an avalanche photodiode;
at least one processor; and

16 a memory coupled to the at least one processor, the memory storing instructions that, when executed by the at least one processor, cause the at least one processor to:
generate an image by a generation unit based on a signal acquired by the photoelectric conversion element;
correct the image by a first correction unit based on first characteristic information on crosstalk between pixels of the photoelectric conversion element; and
perform pixel interpolation of the image by a second correction unit based on second characteristic information for determining a crosstalk region to neighboring pixels of a specific pixel and the image,
wherein the second characteristic information is information which is set based on the first characteristic information,
wherein the second correction unit is configured to calculate a first pixel value by subtracting a value of neighboring pixels of a target pixel in the image from a pixel value of the target pixel and to calculate a second pixel value by multiplying the first pixel value by a predetermined gain multiple,
wherein the second correction unit is configured to determine the target pixel as a target pixel of the pixel interpolation based on a correction level obtained by comparing the second pixel value with a plurality of determination threshold values, and
wherein the second correction unit is configured not to determine the target pixel as the target pixel of the pixel interpolation when the second pixel value is greater than the determination threshold value and the pixel value of the neighboring pixels is not greater by a predetermined value than the second pixel value.

2. The imaging device according to claim 1, wherein the neighboring pixels include pixels vertically, horizontally, and obliquely adjacent to the target pixel, and
wherein the second correction unit is configured to acquire the first pixel value by subtracting a maximum pixel value of pixel values of a plurality of neighboring pixels of the target pixel from the pixel value of the target pixel.

3. The imaging device according to claim 2, wherein each pixel of the photoelectric conversion element includes a color filter, and
wherein the neighboring pixels are pixels vertically, horizontally, and obliquely adjacent to the target pixel and having the same color as the target pixel.

4. The imaging device according to claim 1, wherein the determination threshold value is changed in inverse proportion to the predetermined gain multiple.

5. The imaging device according to claim 1, wherein the second correction unit is configured to determine the target pixel of the pixel interpolation based on the correction level and the second characteristic information.

6. The imaging device according to claim 1, wherein the determination threshold value is increased as the predetermined gain multiple increases.

7. An imaging method comprising:
generating an image based on a signal acquired by a photoelectric conversion element including an avalanche photodiode;
performing a first correction process for correcting the image based on first characteristic information on crosstalk between pixels of the photoelectric conversion element; and performing a second correction process for performing pixel interpolation of the image based on second characteristic information for determining a crosstalk region to neighboring pixels of a specific pixel and the image, wherein the second characteristic information is information which is set based on the first characteristic information, wherein the second correction process is configured to calculate a first pixel value by subtracting a value of neighboring pixels of a target pixel in the image from a pixel value of the target pixel and to calculate a second pixel value by multiplying the first pixel value by a predetermined gain multiple, wherein the second correction process is configured to determine the target pixel as a target pixel of the pixel interpolation based on a correction level obtained by comparing the second pixel value with a plurality of determination threshold values, and wherein the second correction process is configured not to determine the target pixel as the target pixel of the pixel interpolation when the second pixel value is greater than the determination threshold value and the pixel value of the neighboring pixels is not greater by a predetermined value than the second pixel value.

8. A non-transitory computer-readable storage medium configured to store a computer program comprising instructions for executing following processes:

generating an image based on a signal acquired by a photoelectric conversion element including an avalanche photodiode;

performing a first correction process for correcting the image based on first characteristic information on crosstalk between pixels of the photoelectric conversion element; and performing a second correction process for performing pixel interpolation of the image based on second characteristic information for determining a crosstalk region to neighboring pixels of a specific pixel and the image, wherein the second characteristic information is information which is set based on the first characteristic information, wherein the second correction process is configured to calculate a first pixel value by subtracting a value of neighboring pixels of a target pixel in the image from a pixel value of the target pixel and to calculate a second pixel value by multiplying the first pixel value by a predetermined gain multiple, wherein the second correction process is configured to determine the target pixel as a target pixel of the pixel interpolation based on a correction level obtained by comparing the second pixel value with a plurality of determination threshold values, and wherein the second correction process is configured not to determine the target pixel as the target pixel of the pixel interpolation when the second pixel value is greater than the determination threshold value and the pixel value of the neighboring pixels is not greater by a predetermined value than the second pixel value.

9. The imaging device according to claim 1, wherein the second characteristic information is used for determining a crosstalk region.

10. The imaging device according to claim 1, wherein the second characteristic information includes threshold values or array data for determining pixels affected by crosstalk.

* * * * *